(12) United States Patent
Tan et al.

(10) Patent No.: US 11,942,459 B2
(45) Date of Patent: Mar. 26, 2024

(54) SEMICONDUCTOR DEVICE PACKAGE WITH EXPOSED BOND WIRES

(71) Applicant: Western Digital Technologies, Inc., San Jose, CA (US)

(72) Inventors: Hua Tan, Shanghai (CN); Hope Chiu, Shanghai (CN); Weiting Jiang, Shanghai (CN); Elley Zhang, Shanghai (CN); Cong Zhang, Shanghai (CN); Simon Dong, Shanghai (CN); Jerry Tang, Shanghai (CN); Rosy Zhao, Shanghai (CN)

(73) Assignee: Western Digital Technologies, Inc., San Jose, CA (US)

( * ) Notice: Subject to any disclaimer, the term of this patent is extended or adjusted under 35 U.S.C. 154(b) by 299 days.

(21) Appl. No.: 17/670,763

(22) Filed: Feb. 14, 2022

(65) Prior Publication Data

US 2023/0260975 A1    Aug. 17, 2023

(51) Int. Cl.
*H01L 25/10* (2006.01)
*H01L 25/00* (2006.01)
*H01L 25/065* (2023.01)

(52) U.S. Cl.
CPC ........ *H01L 25/105* (2013.01); *H01L 25/0657* (2013.01); *H01L 25/50* (2013.01); *H01L 2225/06506* (2013.01); *H01L 2225/06562* (2013.01); *H01L 2225/06586* (2013.01); *H01L 2225/1058* (2013.01)

(58) Field of Classification Search
CPC ............... H01L 25/105; H01L 25/0657; H01L 2225/06506
See application file for complete search history.

(56) References Cited

U.S. PATENT DOCUMENTS

| 7,750,465 B2 | 7/2010 | Hess et al. |
| 8,026,589 B1 | 9/2011 | Kim et al. |
| 8,253,232 B2 | 8/2012 | Kim et al. |

(Continued)

FOREIGN PATENT DOCUMENTS

| JP | 2007123595 A | 5/2007 |
| JP | 2009044110 A | 2/2009 |

(Continued)

*Primary Examiner* — Thao P Le
(74) *Attorney, Agent, or Firm* — Morgan, Lewis & Bockius LLP; Sandhal Olds

(57) ABSTRACT

A semiconductor device package includes a first substrate having an electrical circuit, semiconductor dies stacked one on top of the other, and bond wires electrically connected one to another. The bond wires electrically couple the semiconductor dies to one another and to the electrical circuit. There is a first bond wire having a first portion connected to a first semiconductor die, a second portion connected to a second semiconductor die, and an intermediate portion between the first portion and second portion. The semiconductor device package further includes a molding compound encapsulating the semiconductor dies, and the first and second portions of the first bond wire. The intermediate portion of the first bond wire is exposed along a top planar surface of the molding compound. The semiconductor device package may be used for coupling one or more other semiconductor device packages thereto via the exposed intermediate portion.

20 Claims, 13 Drawing Sheets

(56) References Cited

U.S. PATENT DOCUMENTS

| | | | |
|---|---|---|---|
| 9,620,492 B2 | 4/2017 | Jeong | |
| 2019/0035705 A1* | 1/2019 | Mao | H01L 24/32 |
| 2019/0103409 A1* | 4/2019 | Xu | H10B 20/50 |
| 2020/0098728 A1* | 3/2020 | Xing | H01L 24/49 |
| 2021/0175182 A1* | 6/2021 | Paek | H01L 21/561 |
| 2021/0183843 A1* | 6/2021 | Arifeen | H01L 25/50 |
| 2021/0288034 A1* | 9/2021 | Kim | H01L 24/20 |
| 2021/0366875 A1* | 11/2021 | Di | H01L 25/50 |
| 2022/0084977 A1* | 3/2022 | Fay | H01L 24/48 |
| 2022/0336419 A1* | 10/2022 | Boo | H01L 25/50 |
| 2023/0055425 A1* | 2/2023 | Jensen | H01L 25/50 |
| 2023/0133965 A1* | 5/2023 | Athavale | H01L 25/0652 |
| | | | 257/777 |
| 2023/0178502 A1* | 6/2023 | Goh | H01L 25/0657 |
| | | | 257/777 |

FOREIGN PATENT DOCUMENTS

| | | |
|---|---|---|
| JP | 2009111392 A | 5/2009 |
| KR | 20100112446 A | 10/2010 |

* cited by examiner

SEMICONDUCTOR DEVICE PACKAGE WITH EXPOSED BOND WIRES

BACKGROUND

The present disclosure generally relates to packaging for semiconductor devices (e.g., NAND flash devices) and assembly thereof and, more particularly, to a package for a semiconductor device configured to couple to one or more other packaged semiconductor devices and methods of assembly thereof.

Semiconductor device packages typically include one or more integrated circuit (IC) dies (e.g., NAND dies, application-specific integrated circuit (ASIC) dies, controller dies, etc.) and/or other semiconductor devices that are electrically coupled to a substrate by bond wires or solder balls that convey electrical signals between the dies and substrate. The semiconductor device packages are often coupled to one or more other semiconductor device packages in order to increase storage capacity. Coupling of semiconductor device packages often includes the use of vertical bond wires that electrically connect one semiconductor device package to another. Vertical bond wires are often prone to wire sweep and provide a relatively small surface area upon which an electrical connection may be formed. Additionally, in single semiconductor device packages where a large number of dies are stacked one on top of the other within a limited space, die bending and/or collapse often occurs due to lack of mechanical support between the semiconductor dies.

SUMMARY

In one embodiment there is a semiconductor device package including a first substrate having an electrical circuit, and a plurality of semiconductor dies stacked one on top of the other and positioned above the first substrate. The semiconductor device package also includes a plurality of bond wires electrically connected one to another and electrically coupling the plurality of semiconductor dies to one another and to the electrical circuit on the first substrate, the plurality of bond wires including a first bond wire having a first portion connected to a first semiconductor die of the plurality of semiconductor dies, a second portion connected to a second semiconductor die of the plurality of semiconductor dies, and an intermediate portion between the first portion and second portion. The semiconductor device package also includes a molding compound encapsulating the plurality of semiconductor dies, the first portion of the first bond wire, and second portion of the first bond wire, wherein the molding compound has top and side planar surfaces, the side planar surface being substantially perpendicular to the top planar surface. the intermediate portion of the first bond wire is exposed along the top planar surface of the molding compound. the intermediate portion of the first bond wire is configured to contact a conductive component.

In some embodiments, the conductive component is a conductive pad positioned on the top planar surface of the molding compound. In some embodiments, the semiconductor device package further includes a second substrate, a solder ball, a third semiconductor die, and a second bond wire electrically coupling the third semiconductor die to the second substrate, and the solder ball is electrically connected to the conductive pad such that the third semiconductor die is in electrical communication with the plurality of semiconductor dies and the electrical circuit of the first substrate.

In some embodiments, the semiconductor device package further includes a set of third bond wires each electrically coupling the plurality of semiconductor dies to the electrical circuit of the first substrate, each third bond wire of the set of third bond wires including a first portion connected to the first semiconductor die of the plurality of semiconductor dies, a second portion connected to the second semiconductor die of the plurality of semiconductor dies, and an intermediate portion extending between the first portion and second portion of each of the set of third bond wires. The molding compound may encapsulate the first portion and second portion of each of the set of third bond wires, the intermediate portion of each of the third bond wires may be exposed along the top planar surface of the molding compound, and the intermediate portion of each bond wire of the third set of bond wires may be configured to contact each of a plurality of conductive components.

In some embodiments, the conductive pad is coupled to the top planar surface of the molding compound and is electrically connected to the intermediate portion of the first bond wire. In some embodiments, the intermediate portion has a surface area that is greater than a cross section of the first bond wire. In some embodiments, the second semiconductor die is disposed between the first semiconductor die and the first substrate.

In another embodiment there is a semiconductor device package including a first substrate having an electrical circuit, and a plurality of semiconductor dies stacked one on top of the other and positioned above the first substrate. The semiconductor device package further includes a plurality of bond wires electrically connected one to another and electrically coupling the plurality of semiconductor dies to one another and to the electrical circuit on the first substrate, the plurality of bond wires including a first bond wire having a first portion connected to a first semiconductor die of the plurality of semiconductor dies, a second portion connected to the electrical circuit of the first substrate, and an intermediate portion between the first portion and second portion. The semiconductor device package further includes a molding compound encapsulating the plurality of semiconductor dies, the first portion of the first bond wire, and second portion of the first bond wire, wherein the molding compound has top and side planar surfaces, the side planar surface being substantially perpendicular to the top planar surface. The intermediate portion of the first bond wire is exposed along the side planar surface of the molding compound, and the intermediate portion of the first bond wire is configured to contact a conductive component.

In some embodiments, the conductive component is a redistribution layer positioned on the side planar surface of the molding compound. In some embodiments, the semiconductor device package further includes a second substrate having a top planar surface and an electrical circuit, the top planar surface being oriented generally perpendicular to the top planar surface of the first substrate, a second redistribution layer electrically connected to the top planar surface of the second substrate, and a solder ball electrically connecting the redistribution layer positioned on the side planar surface of the molding compound to the second redistribution layer.

In some embodiments, the semiconductor device package further includes a third substrate having a top planar surface and an electrical circuit, the top planar surface being oriented generally parallel to the top planar surface of the first substrate, a second plurality of semiconductor dies stacked one on top of the other and positioned above the third substrate, a second plurality of bond wires electrically connected one to another and electrically coupling the second plurality of semiconductor dies to one another and to the electrical circuit on the third substrate, the second plurality of bond wires including a first bond wire having a first portion connected to a first semiconductor die of the second plurality of semiconductor dies, a second portion connected to the electrical circuit of the third substrate, and an intermediate portion between the first portion and second portion, a second molding compound encapsulating the second plurality of semiconductor dies, the first portion of the first bond wire, and second portion of the first bond wire, wherein the second molding compound has top and side planar surfaces, the side planar surface being substantially perpendicular to the top planar surface, a third redistribution layer coupled to the side planar surface of the second molding compound, and a second solder ball electrically connected to the third redistribution layer. The intermediate portion of the first bond wire is exposed along the side planar surface of the second molding compound and is electrically connected to the third redistribution layer, and the second solder ball is electrically connected to a fourth redistribution layer electrically connected to the top planar surface of the second substrate.

In some embodiments, the conductive pad is coupled to the side planar surface of the molding compound and electrically connected to the intermediate portion of the first bond wire. In some embodiments, the intermediate portion has a surface area that is greater than a cross section of the first bond wire.

In another embodiment there is a method of forming a semiconductor device package including providing a first substrate having an electrical circuit, providing one or more components coupled to the first substrate, the one or more components including a plurality of semiconductor dies stacked one on top of the other and positioned above the first substrate, and a plurality of bond wires electrically connected one to another and electrically coupling the plurality of semiconductor dies to one another and to the electrical circuit of the first substrate, the plurality of bond wires including a first bond wire having a first portion connected to a first semiconductor die of the plurality of semiconductor dies, a second portion connected to a second semiconductor die of the plurality of semiconductor dies, and an intermediate portion extending between the first portion and second portion. The method further includes encapsulating the plurality of semiconductor dies, and the first portion and second portion of the first bond wire with a molding compound, wherein the molding compound has top and side planar surfaces, the side planar surface being substantially perpendicular to the top planar surface, and exposing the intermediate portion of the first bond wire along the top planar surface of the molding compound. The intermediate portion of the first bond wire is configured to contact a conductive component.

In some embodiments, the conductive component is one of a conductive pad and a redistribution layer formed on the surface of the molding compound. In some embodiments, the method further includes providing a second substrate, providing a solder ball, providing a third semiconductor die, providing a second bond wire electrically coupling the third semiconductor die to the second substrate, and electrically connecting the solder ball to the conductive pad such that the third semiconductor die is in electrical communication with the plurality of semiconductor die and the electrical circuit of the first substrate. In some embodiments, the conductive component is coupled to the top surface of the molding compound at the intermediate portion of the first bond wire.

In some embodiments, the method further includes providing a set of third bond wires each electrically coupling the plurality of semiconductor dies to the electrical circuit of the first substrate, each third bond wire of the set of third bond wires including a first portion connected to the first semiconductor die of the plurality of semiconductor dies, a second portion connected to the second semiconductor die of the plurality of semiconductor dies, and an intermediate portion extending between the first portion and second portion of each of the set of third bond wires, encapsulating the first portion and second portion of each of the set of third bond wires with the molding compound, and exposing the intermediate portion of each of the third bond wires is exposed along the top planar surface of the molding compound, the intermediate portion of each bond wire of the third set of bond wires being configured to contact each of a plurality of conductive components. In some embodiments, the intermediate portion has a surface area that is greater than a cross section of the first bond wire. In some embodiments, the second semiconductor die is disposed between the first semiconductor die and the first substrate.

In another embodiment there is a method of forming a semiconductor device package including providing a first substrate having an electrical circuit, providing one or more components coupled to the first substrate, the one or more components including a plurality of semiconductor dies stacked one on top of the other and positioned above the first substrate, and a plurality of bond wires electrically connected one to another and electrically coupling the plurality of semiconductor dies to one another and to the electrical circuit of the first substrate, the plurality of bond wires including a first bond wire having a first portion connected to a first semiconductor die of the plurality of semiconductor dies, a second portion connected to the electrical circuit of the first substrate, and an intermediate portion extending between the first portion and second portion. The method further includes encapsulating the plurality of semiconductor dies, and the first portion and second portion of the first bond wire with a molding compound, wherein the molding compound has top and side planar surfaces, the side planar surface being substantially perpendicular to the top planar surface, and exposing the intermediate portion of the first bond wire along the side planar surface of the molding compound, the intermediate portion of the first bond wire being configured to contact a conductive component.

BRIEF DESCRIPTION OF THE DRAWINGS

The foregoing summary, as well as the following detailed description, will be better understood when read in conjunction with the appended drawings. For the purpose of illustrating the present disclosure, there are shown in the drawings embodiments, which are presently preferred, wherein like reference numerals indicate like elements throughout. It should be noted, however, that aspects of the present disclosure can be embodied in different forms and thus should not be construed as being limited to the illustrated embodiments set forth herein. The elements illustrated in the accompanying drawings are not necessarily drawn to scale, but rather, may have been exaggerated to highlight the important features of the subject matter therein. Furthermore, the drawings may have been simplified by omitting elements that are not necessarily needed for the understanding of the disclosed embodiments.

In the Drawings.

DETAILED DESCRIPTION

The present subject matter will now be described more fully hereinafter with reference to the accompanying Figures, in which representative embodiments are shown. The present subject matter can, however, be embodied in different forms and should not be construed as limited to the embodiments set forth herein. Rather, these embodiments are provided to describe and enable one of skill in the art.

Figure 1:
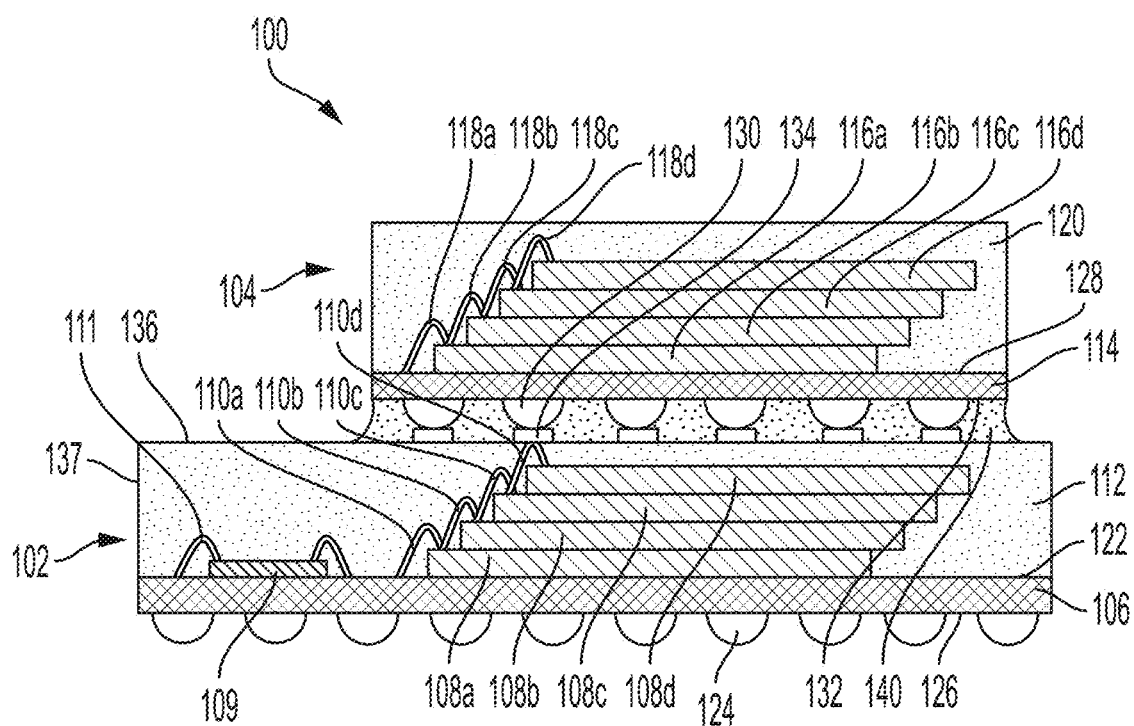
FIG. 1 is a cross-sectional side view of a semiconductor device package with exposed bond wires in accordance with an exemplary embodiment of the present disclosure.

Referring to FIG. 1, there is shown a cross-sectional side view of a semiconductor device package with exposed bond wires, generally designated 100, in accordance with an exemplary embodiment of the present disclosure. The semiconductor device package 100 may include a first semiconductor device package 102 and a second semiconductor device package 104 electrically connected to one another. The first semiconductor device package 102 may include a first substrate 106, one or more semiconductor dies 108a-108d, and bond wires 110a-110b, all of which being at least partially encapsulated within a first mold compound 112. The second semiconductor device package 104 may include a second substrate 114, one or more semiconductor dies 116a-116d, and bond wires 118a-118d, all of which being at least partially encapsulated within a second mold compound 120. The first mold compound 112 and/or second mold compound 120 may include, for example, an epoxy molding compound (EMC) or other encapsulant material known in the art.

The first semiconductor device package 102 and/or second semiconductor device package 104 may be any type of semiconductor device, such as a system-in-package (SiP). In one nonlimiting example, the first semiconductor device package 102 and/or second semiconductor device package 104 is a storage device (e.g., a secure digital (SD) card or a MultiMediaCard (MMC)) and the semiconductor dies 108a-108d and 116a-116d are NAND memory dies. In some embodiments, the semiconductor device package 100 may be any type of semiconductor device, such as an SiP, or package-on-package (PoP).

In some embodiments, the first substrate 106 may be a mechanical base support for the first semiconductor device packages 102 and an electrical interface (or electrical circuit) that provides access to the semiconductor dies 108a-108d housed within the first semiconductor device package 102. For example, the first substrate 106 may include a plurality of metal layers disposed within the first substrate 106, including at least one layer for routing data using conductive (e.g., copper) traces, a ground layer, and/or a power layer. In some embodiments, the first substrate 106 includes a top planar surface 122 upon which at least one of the semiconductor dies 108a-108d and/or other elements are mounted. Each of the semiconductor dies 108a-108d may include a top planar surface that is substantially parallel to the top planar surface 122 of the first substrate. The first semiconductor device package 102 may include one or more solder balls 124 mounted on a bottom planar surface 126 of the first substrate 106 and in electrical communication with the first substrate 106. The one or more solder balls 124 may be configured to electrically and/or mechanically couple the first semiconductor device package 102 may be to one or more other electrical components (not shown) exterior to the first semiconductor device package 102.

In some embodiments, the second substrate 114 may be a mechanical base support for the second semiconductor device package 104 and an electrical interface that provides access to the semiconductor dies 116a-116d housed within the second semiconductor device package 104. For example, the second substrate 114 may include a plurality of metal layers disposed within the second substrate 114, including at least one layer for routing data using conductive (e.g., copper) traces, a ground layer, and/or a power layer. In some embodiments, the second substrate 114 includes a top planar surface 128 upon which at least one of the semiconductor dies 116a-116d and/or other elements are mounted. The second semiconductor device package 104 may include one or more solder balls 130 mounted on a bottom planar surface 132 of the second substrate 114 and in electrical communication with the second substrate 114. The one or more solder balls 130 may be configured to electrically and/or mechanically couple the second semiconductor device package 104 to the first semiconductor device package 102, as discussed in more detail below.

In some embodiments, the semiconductor dies 108a-108d are stacked, one on top of the other and the bottom most semiconductor die 108a is coupled to the top planar surface 122 of the first substrate 106. For example, semiconductor die 108a is coupled to the top planar surface 122 of the first substrate 106, semiconductor die 108b is coupled to the top surface of semiconductor die 108a, and so on. Although only four semiconductor dies 108a-108d are shown, it will be understood that the first semiconductor device package 102 may include fewer than four or greater than four semiconductor dies. For example, the first semiconductor device package 102 may include between one and twenty-four semiconductor dies, stacked one on top of the other, similar to what is shown in FIG. 1. Similarly, the semiconductor dies 116a-116d may be stacked, one on top of the other, and the bottom most semiconductor die 116a may be coupled to the top planar surface 128 of the second substrate 114. Although only four semiconductor dies 116a-116d are shown included in the second semiconductor device package 104, it will be understood that fewer than four or greater than four semiconductor dies may be included in the second semiconductor device package 104. For example, the second semiconductor device package 104 may include between one and twenty-four semiconductor dies, stacked one on top of the other, similar to what is shown in FIG. 1.

In some embodiments, the first semiconductor device package 102 includes a controller 109 configured to provide electrical communication with the semiconductor dies 108a-108d and/or semiconductor dies 116a-116d. In some embodiments, the controller 109 is an application specific integrated circuit (ASIC) chip configured to control the functionality of the semiconductor dies 108a-108d and/or semiconductor dies 116a-116d. In some embodiments, the controller 109 is electrically connected to the substrate 106 by one or more bond wires 111. In other embodiments, the controller 109 is a flip-chip die that is mounted on and electrically connected to the first substrate 106 using flip chip mounting.

Each semiconductor die 108a-108d may be electrically connected to the adjacent semiconductor dies 108a-108d and/or the first substrate 106 via one the corresponding bond wires 110a-110d. For example, semiconductor die 108a is electrically connected to the first substrate 106 by bond wire 110a, semiconductor die 108b is electrically connected to semiconductor die 108a by bond wire 110b, and so on. In this manner, the semiconductor dies 108a-108d may be in electrical communication with one another, the first substrate 106, and/or the controller 109. Similarly, semiconductor dies 116a-116d may be electrically connected to the adjacent semiconductor dies 116a-116d and/or the second substrate 114 via the corresponding bond wires 118a-118d. For example, semiconductor die 116a is electrically connected to the second substrate 114 by bond wire 118a, semiconductor die 116b is electrically connected to semiconductor die 116a by bond wire 118b, and so on. In this manner, the semiconductor dies 116a-116d may be in electrical communication with one another and with the second substrate 114.

In some embodiments, one or more of the bond wires 110a-110d are configured to electrically couple the first semiconductor device package 102 to the second semiconductor device package 104. For example, bond wire 110d may be at least partially exposed along a surface of the first molding compound 112 such that an electrical connection between the first semiconductor device package 102 and second semiconductor device package 104 may be formed via the bond wire 110d. In some embodiments, the first semiconductor device package 102 includes one or more conductive pads 134 mounted to the surface of the first molding compound 112 where the bond wire 110d is at least partially exposed. For example, a portion of the bond wire 110d is exposed along a top planar surface 136 of the first molding compound 112 and the conductive pads 134 are mounted on the top planar surface 136 of the first molding compound 112. The top planar surface 136 of the first molding compound 112 may be substantially parallel to the top planar surface 122 of the first substrate 106 and/or to the top planar surfaces of the semiconductor dies 108a-108d. The first molding compound 112 may include a side planar surface 137 that is substantially perpendicular to the top planar surface 136 of the first molding compound, top planar surface 122 of the first substrate 106 and/or the top planar surfaces of the semiconductor dies 108a-108d. At least one of the conductive pads 134 may be positioned along the top planar surface 136 of the first molding compound 112 such that the conductive pad 134 is electrically connected to the portion of the bond wire 110d that is exposed along the top planar surface 136 of the first molding compound 112.

Figure 2:
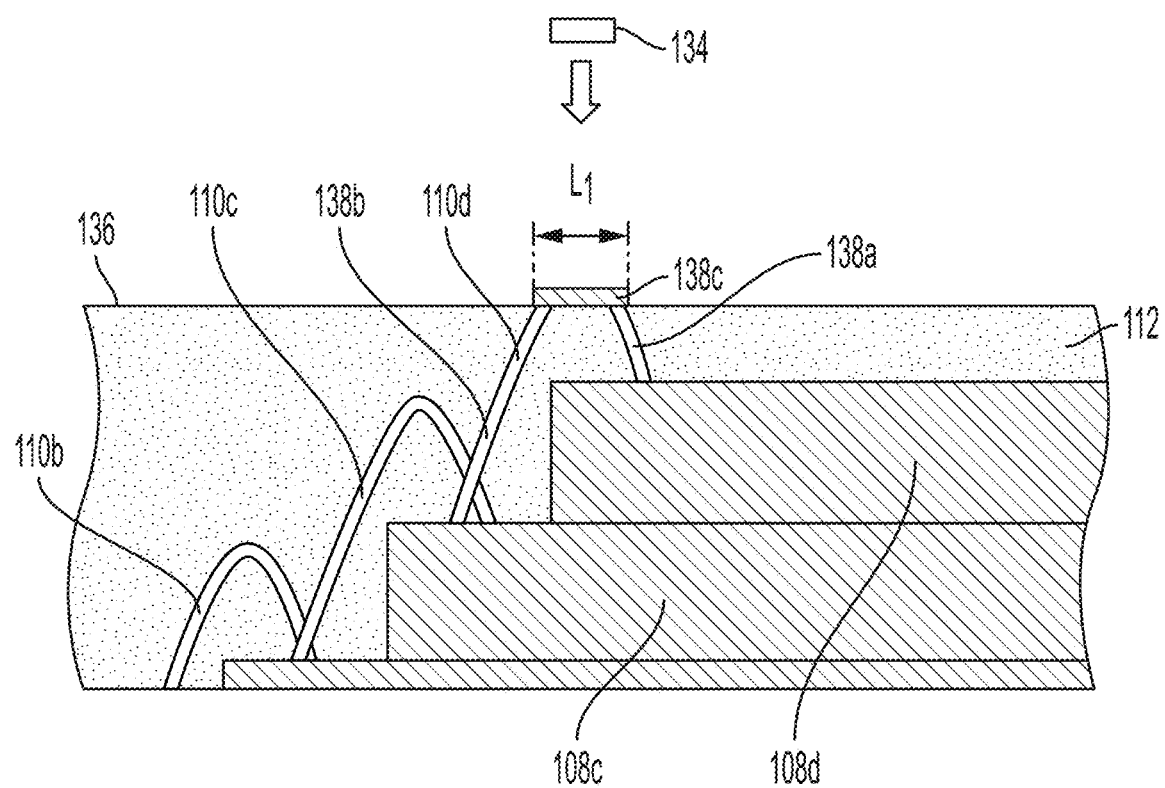
FIG. 2 is a cross-sectional side view of a portion of the first semiconductor device package of the combined semiconductor device package of FIG. 1.

Referring to FIGS. 1-2, the bond wire 110d may include a first portion 138a, a second portion 138b opposite the first portion 138a, and an intermediate portion 138c extending between the first portion 138a and second portion 138b. The first portion 138a, second portion 138b, and intermediate portion 138c may be integrally formed such that the bond wire 110d is a unitary construct. The first portion 138a and second portion 138b may be first and second ends of the bond wire 110d. In some embodiments, the first portion 138a is connected (e.g., physically connected and/or electrically connected) to the uppermost semiconductor die (e.g., semiconductor die 108d) of the first semiconductor device package 102. The second portion 138b may be connected (e.g., physically and/or electrically connected) to the adjacent semiconductor die (e.g., semiconductor die 108c) positioned below the upper most semiconductor die. The uppermost semiconductor die may be positioned above the top planar surface 122 of the first substrate 106 and below the top planar surface 136 of the first molding compound 112. As such, the adjacent semiconductor die (e.g., semiconductor die 108c) may be positioned between the uppermost semiconductor die and the top planar surface 122 of the first substrate 106.

In some embodiments, the intermediate portion 138c of the bond wire 110d is exposed along a surface of first molding compound 112 such that one or more other components may be electrically connected to the intermediate portion 138c. For example, the intermediate portion 138c may be exposed along a top planar surface 136 of the first molding compound 112 such that the first molding compound 112 does not cover the intermediate portion 138c. In this manner, the intermediate portion 138c may act as an electrical interface surface exposed at the top planar surface 136 of the first molding compound 112 that one or more other components (e.g., conductive pad 134) may be electrically connected to. In some embodiments, the intermediate portion 138c extends along the top planar surface 136 of the first molding compound 112 by a length $L_1$. The length $L_1$ of the intermediate portion 138c may be greater than the diameter of a cross-section of the bond wire 110d. In some embodiments, the length $L_1$ of the intermediate portion 138c is about four to twenty times greater than the diameter of the bond wire 110d. For example, the diameter of the bond wire 110d may be about 25 micrometers and the length $L_1$ may be about 200 micrometers. In some embodiments, the length $L_1$ of the intermediate portion 138c is at least 100 micrometers.

In FIG. 2, the intermediate portion 138c is illustrated as being generally parallel to the top planar surface 136 of the first molding compound 112, however, it will be understood that the intermediate section 138c may have an irregular or uneven shape. For example, the intermediate portion 138c may be generally curved or bent along the length $L_1$.

The length $L_1$ of the intermediate portion 138c being greater than the diameter of the bond wire 110d may increase the surface area exposed at the top planar surface 136 of the first molding compound 112 that may act as an electrical interface as compared to conventional semiconductor device packages. For example, in conventional semiconductor device packages, the semiconductor dies are electrically connected to one another via bond wires that are similar to the bond wires 110a-110d, except that the bond wires of the conventional semiconductor device package are entirely encapsulated by a molding compound. In order to provide an electrical interface surface that is exposed at a surface of the molding compound, a vertical bond wire is typically provided. The vertical bond wire is typically connected to a semiconductor die and extends vertically upward from that semiconductor die to the top planar surface of a molding compound that encapsulates the components of the semiconductor device package.

A terminal end of the vertical bond wire is typically exposed at the top planar surface of the molding compound to allow one or more other components to be electrically connected to the vertical bond wire. As such, the terminal end of the vertical bond wire that acts as an electrical interface surface has a generally circular shape defined by the diameter of the vertical bond wire. Put another way, the vertical bond wire has a generally circular cross-sectional shape defined by the diameter of the vertical bond wire. Furthermore, the vertical bond wire is generally perpendicular relative to a top planar surface of the molding compound, and therefore the electrical interface surface is also generally circular and has a surface area defined by the diameter of the vertical bond wire. In the embodiments of the present disclosure discussed above, the intermediate portion 138c of the bond wire 110d is not oriented vertically relative to the top planar surface 136 of the first molding compound. Instead, the intermediate portion 138c extends along a portion of the top planar surface 136 of the first molding compound 112 by length $L_1$. In this manner, the intermediate portion 138c of the bond wire 110d provides a greater electrical interface surface area as compared to a conventional semiconductor device package that includes a vertical bond wire for providing the electrical interface surface.

In some embodiments, the bond wire 110d may be less prone to wire sweep, during flowing of the first molding compound 112, as compared to a vertical bond wire included in a conventional semiconductor device package. For example, in conventional semiconductor device packages, vertical bond wires are often prone to wire sweep during flowing of the molding compound that encapsulates the components of the conventional semiconductor device package. The bond wire 110d according to the present disclosure is mechanically and electrically connected at opposing ends (e.g., the first portion 138a and second portion 138b) to semiconductor dies 108c-108d, whereas a vertical bond wire is mechanically and electrically connected at a single end. In this manner, the bond wire 110d may be less prone to wire sweep than the vertical bond wire of a conventional semiconductor device package.

In some embodiments, one or more of the conductive pads 134 may be in electrical communication with the intermediate portion 138c of the bond wire 110d. For example, at least one of the conductive pads 134 may be positioned on the top planar surface 136 of the first molding compound 112 along at least a portion of the length $L_1$ of the intermediate portion 138c of the bond wire 110d. In this manner, at least one of the conductive pads 134 may be electrically connected to the bond wire 110d. As such, the conductive pad 134 may be in electrical communication with the components of the first semiconductor device package 102 (e.g., the first substrate 106, controller 109, and/or semiconductor dies 108a-108d) via bond wire 110d. In some embodiments, the conductive pad 134 may be bonded to the intermediate portion 138c of the bond wire 110d.

In some embodiments, the second semiconductor device package 104 is electrically connected to the first semiconductor device package 102 via the conductive pads 134. The solder balls 130 of the second semiconductor device package 104 may be bonded to the conductive pads 134 of the first semiconductor device package 102 such that the solder balls 130 and conductive pads 134 are in electrical communication with one another. As discussed above, at least one of the conductive pads 134 is electrically connected to the intermediate portion 138c of bond wire 110d. As such, at least one of the solder balls 130 that is included in the second semiconductor device package 104 may be electrically connected to the conductive pad 134 that is electrically connected to the exposed intermediate portion 138c of bond wire 110d. In this manner, the first semiconductor device package 102 and second semiconductor device package 104 may be electrically connected to one another via the conductive pad 134 that is electrically connected to the intermediate portion 138c of bond wire 110d and the corresponding solder ball 130. As such, electrical signals may be transmitted between the first semiconductor package 102 and second semiconductor device package 104.

In some embodiments, the semiconductor device package 100 includes an underfill 140 between the first semiconductor device package 102 and the second semiconductor device package 104. In some embodiments, the underfill 140 may be configured to provide a mechanical bond between the first semiconductor device package 102 and the second semiconductor device package 104 and protect the solder balls 130, exposed portions of the bond wires (e.g., intermediate section 138c of bond wire 110d), and conductive pads 134 from mechanical stress, and/or provide increased heat transfer capabilities. The underfill 140 may be provided in the space between the top planar surface 136 of the first molding compound 112 and the bottom planar surface 132 of the second substrate 114 and at least partially encapsulate the solder balls 130, intermediate section 138c of bond wire 110d and the conductive pads 134. In some embodiments, the underfill 140 is comprised of a polymer.

Although only two semiconductor device packages are shown in FIG. 1, it will be understood that additional semiconductor device packages may be stacked, one on top of the other, and electrically connected to one another similar to what is shown in FIG. 1. For example, in FIG. 1, a portion of the bond wire, proximate to the top planar surface of the second molding compound 120, (e.g., a portion of bond wire 118d) may be exposed at the top planar surface similar to how the intermediate portion 138c of bond wire 110d is exposed at the top planar surface 136 of the first molding compound 112. One or more conductive pads, similar to conductive pads 134, may be coupled to the top planar surface of the second molding compound 120, at least one of which may be electrically connected to the exposed portion of bond wire 118d. A third semiconductor device package, generally similar to either the first semiconductor device package 102 or second semiconductor device package 104, may be electrically connected to the second semiconductor device package 104 via the conductive pad connected to the exposed portion of bond wire 118d. In some embodiments, this structure may be repeated until a desired number of semiconductor dies and/or semiconductor device packages are included in the semiconductor device package 100.

In some embodiments, the risk of die bending and/or collapse of semiconductor dies 108a-108d and, 116a-116d included in the semiconductor device package 100 may be prevented, or at least reduced, when compared to conventional semiconductor device packages. Die bending and/or collapse may refer to instances where one or more semiconductor dies included in a semiconductor device package bend or deform due to limited area, excess weight caused by a large number of stacked dies and/or lack of mechanical support. For example, conventional semiconductor device packages often include a number of semiconductor dies stacked one on top of the other in a staircase-like pattern within a limited space. As the number of semiconductor dies, stacked one on top of the other is increased within a limited space, the risk of die bending and/or collapse also increases. By providing semiconductor dies in electrical communication with one another, as described above with reference to the semiconductor device package 100 of the present disclosure, the risk of die bending and/or collapse may be prevented, or at least reduced. For example, the semiconductor device package 100 provides additional mechanical support, via at least the multiple substrates (e.g., first substrate 106, second substrate 114) disposed between different stacks of semiconductor dies (e.g., between semiconductor dies 108a-108d and semiconductor dies 116a-116d).

Figure 3:
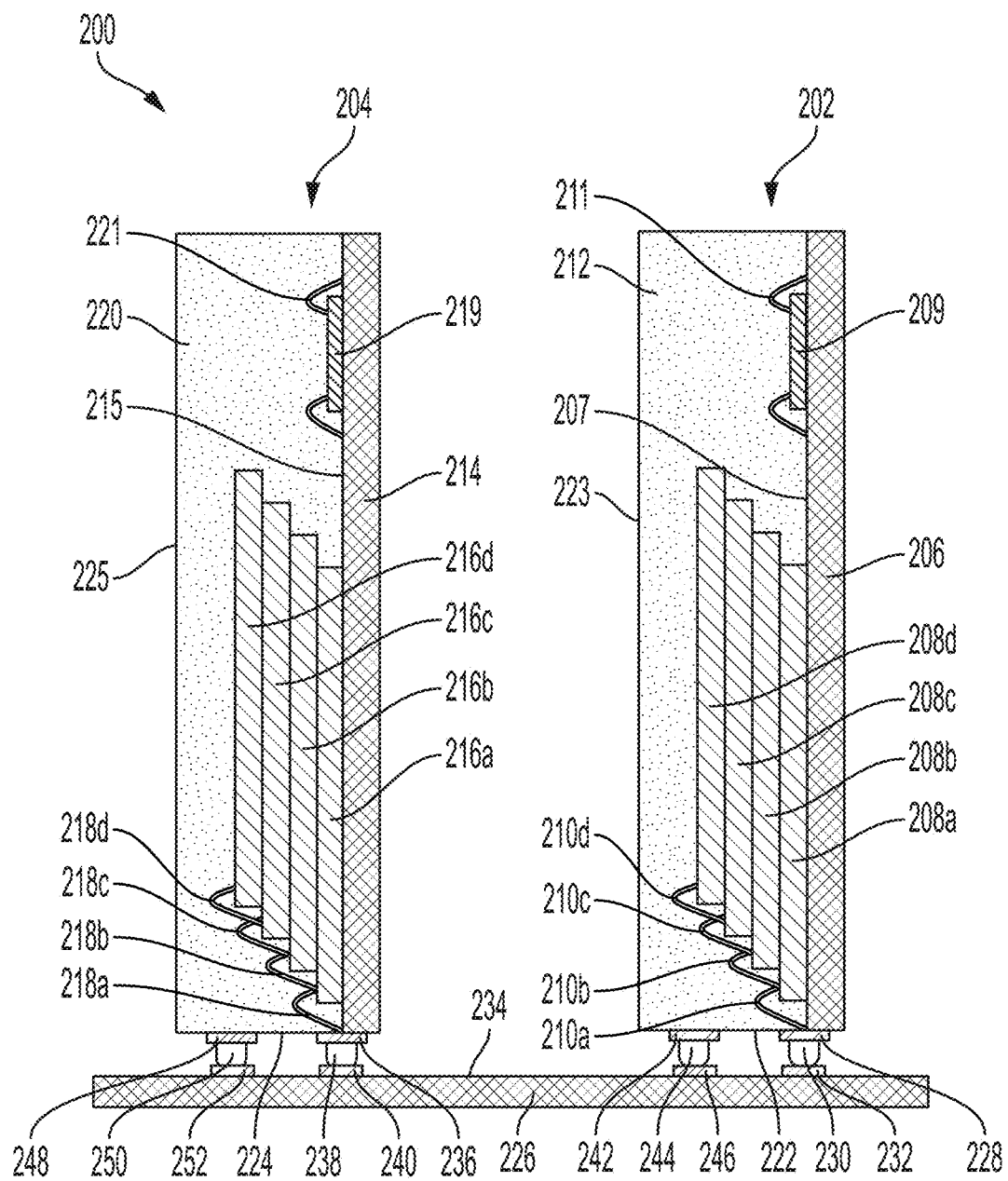
FIG. 3 is a cross-sectional side view of a combined semiconductor device package in accordance with another exemplary embodiment of the present disclosure.

Referring to FIG. 3, there is shown a cross-sectional side view of a combined semiconductor device package, generally designated 200, in accordance with another exemplary embodiment of the present disclosure. The combined semiconductor device package 200 may include a first semiconductor device package 202 and a second semiconductor device package 204 in electrical communication with one another. The first semiconductor device package 202 may include a first substrate 206, one or more semiconductor dies 208a-208d, and a controller 209. The semiconductor dies 208a-208d may be electrically connected to one another and/or to the first substrate 206 via bond wires 210a-210d. For example, semiconductor dies 208a-208d are electrically connected one to another via bond wires 210b-210d and semiconductor die 208a is electrically connected to the first substrate 206 via bond wire 210a. Similarly, the controller 209 may be electrically connected to the first substrate 206 via bond wire(s) 211. In some embodiments, the semiconductor dies 208a-208d, controller 209, bond wires 210a-210d and/or bond wires 211 are at least partially encapsulated by a first molding compound 212. The first molding compound 212 may include, for example, an EMC or other encapsulant material known in the art.

The second semiconductor device package 204 may be generally the same as the first semiconductor device package 202. For example, the second semiconductor device package 204 may include a second substrate 214, one or more semiconductor dies 216a-216d, and a controller 219. The semiconductor dies 216a-216d may be electrically connected to one another and/or to the second substrate 214 via bond wires 218a-218d. For example, semiconductor dies 216a-216d are electrically connected, one to another via bond wires 218b-218d and semiconductor die 216a is electrically connected to the second substrate 214 via bond wire 218a. Similarly, the controller 219 may be electrically connected to the second substrate 214 via bond wire(s) 221. In some embodiments, the semiconductor dies 216a-216d, controller 219, bond wires 218a-218d and/or bond wire(s) 221 are at least partially encapsulated by a second molding compound 220. The second molding compound 220 may include, for example, an EMC or other encapsulant material known in the art.

Both the first semiconductor device package 202 and second semiconductor device package 204 may be similar to the first semiconductor device package 102 described above, with reference to FIGS. 1-2, except that at least one of the bond wires is exposed at a side planar surface of the respective molding compound rather than a top planar surface. For sake of brevity, not all functionality of the substrates 206, 214, semiconductor dies 208a-208d, 216a-216d, controllers 209, 219, and molding compounds 212, 220 will be discussed. It will be understood though that the functionality of each may be generally the same as substrate 106, semiconductor dies 108a-108d, controller 109, and molding compound 112 as discussed above with reference to FIGS. 1-2. The bond wires 210a-210d and 218a-218d may be generally the same as bond wires 110a-110d except that at least one bond wire of each set of bond wires 210a-210d and 218a-218d may be partially exposed at a side planar surface 222 of the first molding compound 212 and a side planar surface 224 of the second molding compound 220 respectively. The side planar surface 222 of the first molding compound 212 and side planar surface 224 of the second molding compound 220 may be substantially perpendicular to the top planar surfaces 207, 215 of the first and second substrates 206, 214, respectively. The side planar surfaces 222, 224 may be substantially perpendicular to top planar surfaces 223, 225 of the first and second molding compounds 212, 220. In some embodiments, by exposing at least a portion of the bond wires 210a and 218a, the first and second semiconductor device packages 202 and 204 may be electrically coupled to a third substrate 226 in the vertical orientation shown in FIG. 3. For example, the third substrate 226 may include a top planar surface 234 that is oriented generally perpendicular to a top planar surface 207 of the first substrate 206 and/or the top planar surface 215 of the second substrate 214.

Figure 4:
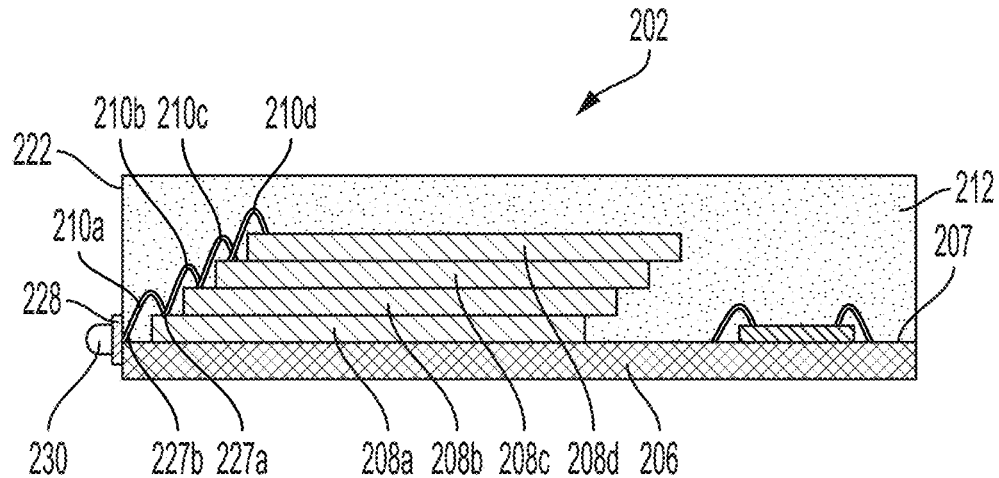
FIG. 4 is a cross-sectional side view of a first semiconductor device package of the combined semiconductor device package of FIG. 3.

The exposed portions of bond wires 210a and 218a will be better understood with reference to FIG. 4, which illustrates a side cross-sectional view of the first semiconductor device package 202 in a horizontal orientation. As mentioned above, the first and second semiconductor device packages 202 and 204 are generally the same and as such, only the first semiconductor device package 202, will be described for sake of brevity. However, it will be understood that the following description of the first semiconductor device package 202 may apply to the second semiconductor device package 204 and the corresponding components thereof.

The bond wire 210a may be at least partially exposed along a side planar surface 222 of the first molding compound 212 such that the bond wire 210a is electrically connected to a conductive pad and/or redistribution layer (RDL) 228 coupled to the side planar surface 222 of the first molding compound 212. In some embodiments, the RDL 228 electrically couples the semiconductor dies 208a-208d to the first substrate 206. For example, the bond wire 210a may have a first portion 227a electrically connected to the semiconductor die 208a and a second portion 227b at least partially exposed at the side planar surface 222 of the first molding compound 212. The RDL 228 may be electrically connected to the exposed area of the second portion 227b such that the RDL 228 is in electrically coupled to the semiconductor die 208a via bond wire 210a. As such, bond wires 210b-210d may electrically couple the remaining semiconductor dies 208b-208d to the RDL 228. The RDL 228 may be electrically connected to the first substrate 206 such that the semiconductor dies 208a-208d are electrically coupled to the first substrate 206 via the RDL 228.

Figure 5:
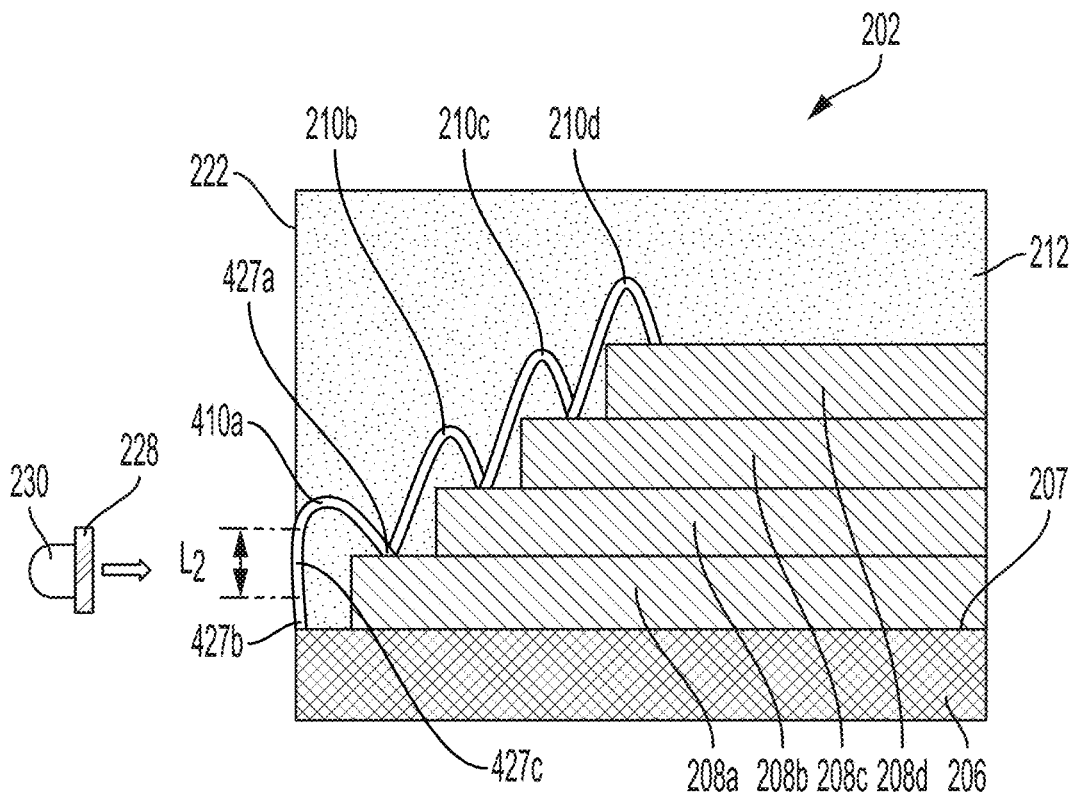
FIG. 5 is a cross-sectional side view of a portion of the first semiconductor device package with a bond wire partially exposed along a side planar surface of the molding compound.

Referring to FIG. 5, there is shown a cross-sectional side view of a portion of the first semiconductor die 202 with a bond wire 410a partially exposed at the side planar surface of the molding compound 212. The bond wire 410a may be generally the same as bond wire 210a, except that bond wire 410a includes an intermediate portion 427c that is exposed at the side planar surface 222 of the molding compound 212. The first portion 427a of the bond wire may be electrically connected to semiconductor die 208a and the second portion 427b may be electrically connected to the top planar surface 207 of the first substrate 206. The intermediate portion 427c may be the portion of the bond wire 410a that extends between the first portion 427a and second portion 427b and that is exposed at the side planar surface 222 of the first molding compound 212. In some embodiments, the intermediate portion 427c is exposed along a length L₂ of the first molding compound 212 such that a conductive pad or the RDL 228 may be electrically connected to the intermediate portion 427c. The RDL 228, when electrically connected to the intermediate portion 427c, may be in electrical communication with at least the first substrate 206 and semiconductor dies 208a-208d. In some embodiments, the length L₂ is greater than a cross-section of the bond wire 410a. In some embodiments, the length L₂ is at least 100 micrometers.

The benefits of exposing a bond wire along a length of the molding compound are discussed above with reference to FIGS. 1-2 and bond wire 110d and it will be understood that the same benefits apply to the bond wire 410a. Therefore, said benefits will not be discussed again for sake of brevity.

Referring to FIGS. 3-5, it will be understood that the first and second semiconductor device packages 202 and 204 may include a bond wire exposed similar to bond wire 210a and/or 410a. For example, in one embodiment, the first semiconductor device package 202 may include bond wire 410a having the exposed intermediate portion 427c and the second semiconductor device package may include bond wire 218a, which has generally the same configuration as bond wire 210a. In another embodiment, the first semiconductor device package 202 may include bond wire 410a and the bond wire 218a of the second semiconductor device package 204 may have generally the same configuration as bond wire 410a. It will be understood that any combination of bond wire configurations may be used in the semiconductor device packages included in the combined semiconductor device package 200.

In some embodiments, there is a solder ball 230 electrically connected to the RDL 228 for electrically coupling the first semiconductor device package 202 to the third substrate 226. For example, the third substrate 226 may include a conductive pad and/or RDL 232 electrically connected to a top planar surface 234 of the third substrate 226. The solder ball 230 may be electrically connected to the RDL 228 of the first semiconductor device package 202 and RDL 232 of the third substrate 226. In this manner, the first semiconductor device package 202 may be in electrical communication with the first substrate 226. Similarly, the second semiconductor device package 204 may include an RDL 236 electrically connected to bond wire 218a, similar to how RDL 228 is electrically connected to bond wire 210a as described above with reference to FIG. 4. The second semiconductor device package 204 may include a solder ball 238 electrically connected to the RDL 236. There may be a second RDL 240 electrically connected to the top planar surface 234 of the third substrate 226, and the solder ball 238 may be electrically connected to the second RDL 240 such that the second semiconductor device package 204 is electrically coupled to the third substrate 226. As such, the first semiconductor device package 202 and second semiconductor device package 204 may be in electrical communication with one another via the third substrate 226.

In some embodiments, the RDL 228 and corresponding solder ball 230 of the first semiconductor device package 202 are a first RDL 228 and a first solder ball 230, and the semiconductor device package 202 includes additional RDLs and solder balls configured to be electrically connected to the third substrate 226. For example, the first semiconductor device package 202 may include a second RDL 242 and a second solder ball 244 electrically connected to the second RDL 242. The second RDL 242 may be coupled to the side planar surface 222 of the first molding compound 212 and spaced from the first RDL 228. The third substrate 226 may include a third RDL 246 electrically connected to the top planar surface 234, and the second solder ball 244 may be electrically connected to the third RDL 246. In this manner, the first and second RDLs 228, 242 and corresponding solder balls 230, 244 may mechanically and electrically couple the first semiconductor device package 202 to the third substrate 226. In some embodiments, an underfill (not shown) is provided between the top planar surface 234 of the third substrate 226 and side planar surface 222 of the first molding compound 212 to provide additional mechanical support between the first semiconductor device package 202 and the third substrate 226.

The second semiconductor device package 204 may include one or more additional redistribution layers and corresponding solder balls to mechanically and electrically couple the second semiconductor device package 204 to the third substrate 226 similar to the first semiconductor device package 202. For example, the RDL 236 and solder ball 238 may be a first RDL 236 and first solder ball 238 of the second semiconductor device package 204. There may be a second RDL 248, a second solder ball 250 included in the second semiconductor device package 204 and a fourth RDL 252 electrically connected to the top planar surface 234 of the third substrate 226. Similar to the first semiconductor device package 202, the second solder ball 250 may be electrically connected to the second RDL 248 of the second semiconductor device package 204 and the fourth RDL 252 of the third substrate 226. In this manner, the first and second RDLs 236, 248 and corresponding solder balls 238, 250 may mechanically and electrically couple the second semiconductor device package 204 to the third substrate 226. In some embodiments, an underfill (not shown) is provided between the top planar surface 234 of the third substrate 226 and the side planar surface 224 of the second molding compound 220 to provide additional mechanical support between the second semiconductor device package 204 and the third substrate 226.

Although two semiconductor device packages (e.g., first and second semiconductor device packages 202, 204) are shown in FIG. 3, it will be understood that the combined semiconductor device package 200 may include any number of semiconductor device packages coupled to the third substrate 226 and in electrical communication with one another. For example, a third semiconductor device package, generally the same as the first and/or second semiconductor device packages 202, 204, may be electrically connected to the third substrate 226 in generally the same manner as discussed above such that the third semiconductor device package is in electrical communication with the first and second semiconductor device packages 202, 204. In some embodiments, the combined semiconductor device package 200 may include between two to twenty semiconductor device packages, electrically connected to the third substrate 226 and in electrical communication with one another.

Figure 6:
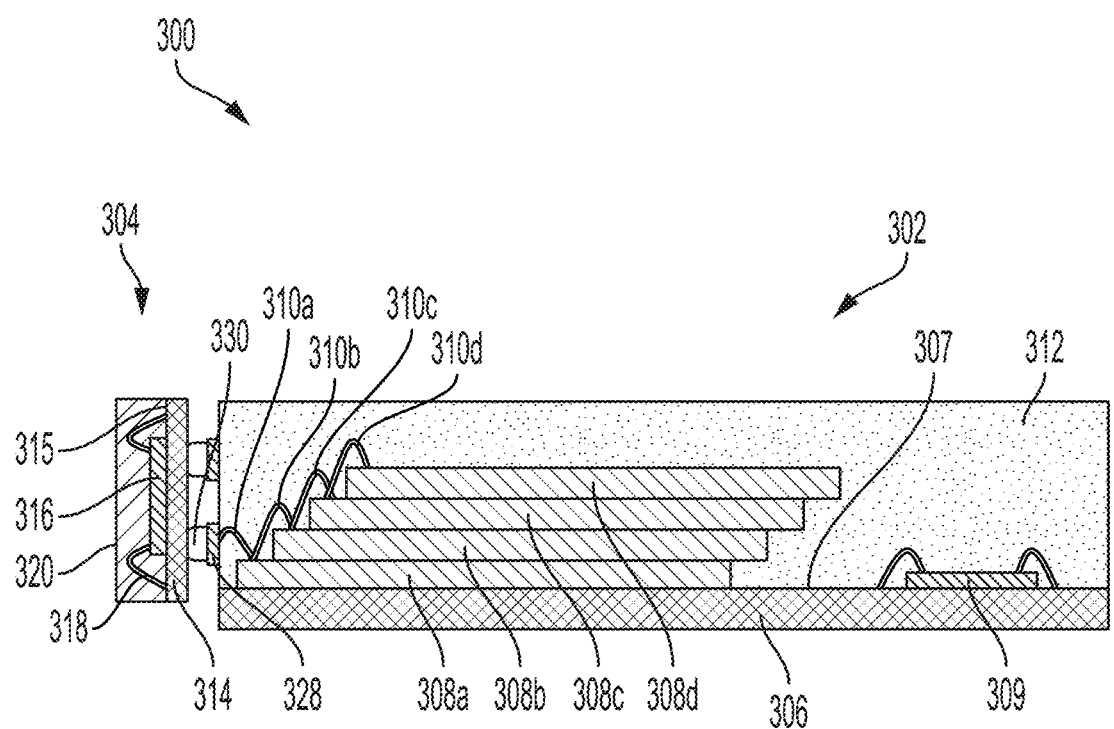
FIG. 6 is a cross-sectional side view of a portion of the first semiconductor device package in accordance with another exemplary embodiment of the present disclosure.

Referring to FIG. 6, there is shown a side cross-sectional view of a combined semiconductor device package 300 in accordance with another embodiment of the present disclosure. The combined semiconductor device package 300 may include a first semiconductor device package 302 and a second semiconductor device package 304 electrically connected thereto. The first semiconductor device package 302 may be generally the same as the first and/or second semiconductor device packages 202, 204 as discussed above with reference to FIGS. 3-5. For example, the first semiconductor device package 302 may include a first substrate 306 having coupled thereto semiconductor dies 308a-308d, controller 309, bond wires 310a-310d, and bond wire(s) 311, each of which being at least partially encapsulated by a first molding compound 312. The first substrate 306, semiconductor dies 308a-308d, controller 309, bond wires 310a-310 and bond wire(s) 311 may be generally the same as substrate 206, semiconductor dies 208a-208d, controller 209, bond wires 210a-210d, and bond wire(s) 211 and will not be described for sake of brevity and so as not to obscure aspects of the present disclosure.

The first semiconductor device package 302 may include an RDL 328 that is generally the same as RDL 228 except that RDL 328 is not directly connected to the first substrate 306. For example, RDL 328 may be electrically connected to the portion of bond wire 310a that is exposed at the side planar surface 322 of the first molding compound 312 such that the RDL 328 is not electrically connected to the substrate 306. In some embodiments, there is a solder ball 330 electrically connected to the RDL 328.

The second semiconductor device package 304 may include second substrate 314 having a top planar surface 315 and at least one semiconductor die 316 electrically connected thereto via one or more bond wires 318. The semiconductor die 316 may be a ASIC chip or a memory die (e.g., a NAND die). In some embodiments, the semiconductor die 316 is a flip-chip die that is mounted on and electrically connected to the second substrate 314 using flip chip mounting. In some embodiments, the semiconductor die 316 is or includes a capacitor or a resistor. In some embodiments, the semiconductor die 316 and bond wires 318 are at least partially encapsulated by a second molding compound 320. The second molding compound 320 may include an EMC or other encapsulant materials known in the art. In some embodiments, the top planar surface 315 of the second substrate 314 is oriented generally perpendicular to a top planar surface 307 of the first substrate 306. In some embodiments, the solder ball 330 is electrically connected to the second substrate 314. In this manner, the first semiconductor device package 302 and second semiconductor device package 304 may be electrically coupled. In some embodiments, by providing a semiconductor die 316 that is oriented generally perpendicular to the semiconductor dies 308a-308d and/or the first substrate 306, the overall length of the semiconductor device package 300 may be reduced. For example, if semiconductor die 316 were oriented generally parallel to the first substrate 306, the overall length of the semiconductor device package 300 may be greater than when the semiconductor die 316 and substrate 314 are oriented generally perpendicularly.

Figure 7A:
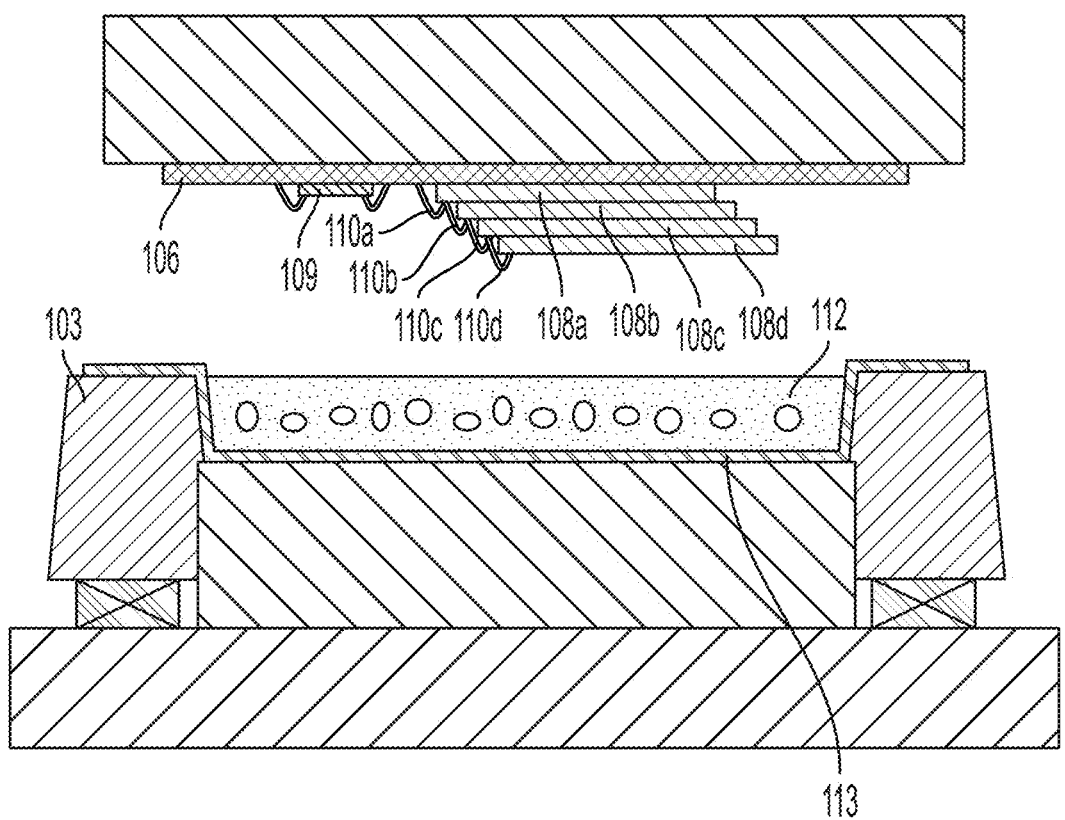
FIGS. 7A-7H illustrate a method of assembly of the combined semiconductor device package of FIGS. 1-2.

Referring to FIGS. 7A-7H there is illustrated a method of assembling the semiconductor device package 100 discussed above with reference to FIGS. 1-2. Referring to FIG. 7A, the first substrate 106 may be provided with one or more components (e.g., the semiconductor dies 108a-108d, controller 109, bond wires 110a-110d) coupled thereto. The bond wires 110a-110d may be electrically connected to the corresponding semiconductor dies 108a-108d and substrate 106, respectively. The first substrate 106 and the components coupled thereto may be positioned above a mold 103, including the first molding compound 112 and a release film 113 positioned between the mold 103 and the first molding compound 112. Put another way, the release film 113 may be positioned along a bottom surface of the mold 103 such that the first molding compound 112 is above the release film 113. In some embodiments, the first molding compound 112 is in a liquid or flowable state such that the first substrate 106 and the components coupled thereto may be immersed in the first molding compound 112. In other embodiments, the first molding compound 112 is provided in the form of a powder such that the mold 103 may be compressed onto the first substrate 106 and the components coupled thereto, thereby causing the first molding compound 112 to transition from a powder state to a liquid or semi-liquid state.

Figure 7B:
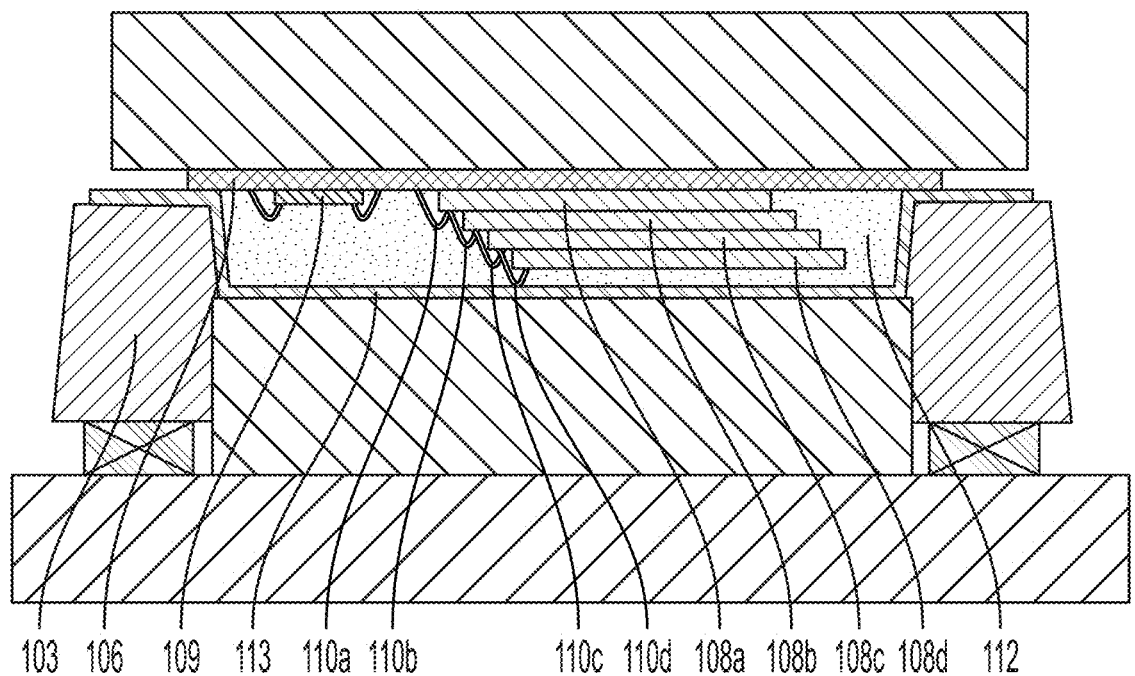

Referring to FIG. 7B, the mold 103 may be compressed onto the first substrate 106 and the components coupled thereto such that the molding compound 112 at least partially encapsulates the semiconductor dies 108a-108d, controller 109, and bond wires 110a-110d. In some embodiments, a portion of the bond wire 110d abuts and/or extends into the release film 113 such that the portion of the bond wire 110d is not encapsulated by the first molding compound 112. For example, the portion of bond wire 110d not encapsulated may be the intermediate portion 138c as described with reference in FIG. 2. In some embodiments, the length of the bond wire 110d, the dimensions of the mold 103, and/or the volume of the first molding compound 112 provided in the mold 103 may be adjusted such that the portion of the bond wire 110d not encapsulated by the first molding compound 112 is adjusted (e.g., increased or decreased). The liquid molding compound 112 may be subsequently cured or hardened such that the liquid mold compound 112 hardens to protect the first substrate 106, semiconductor dies 108a-108d, controller 109, and/or bond wires 110a-110d.

Figure 7C:
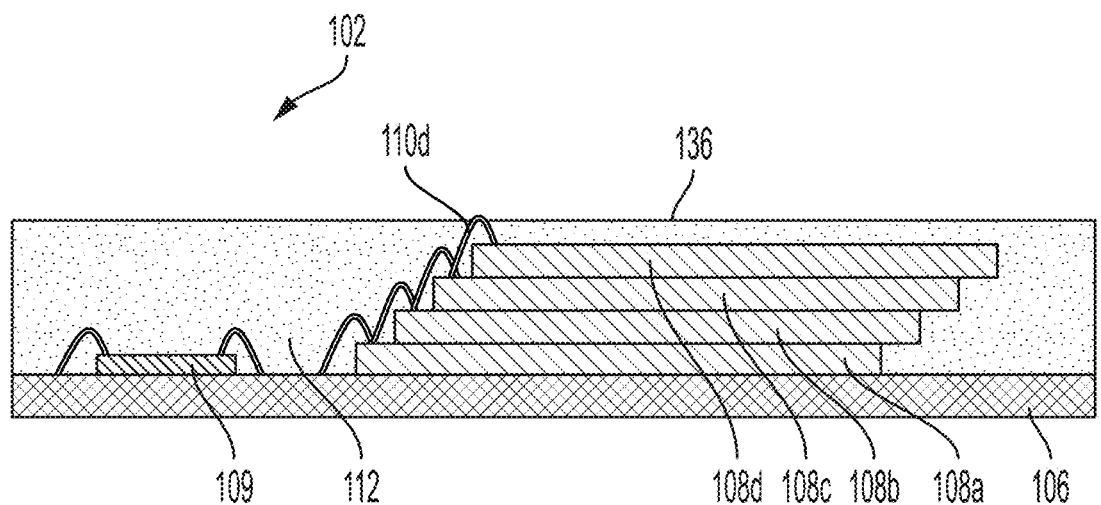

Referring to FIG. 7C, the release film 113 may be removed and the first substrate 106 with at least partially encapsulated components may be removed from the mold 103. In this manner a semiconductor device package having a bond wire exposed at a surface of the molding compound may be assembled. For example, what is shown in FIG. 7C is the first semiconductor device package 102, discussed above with reference to FIGS. 1-2, without the solder balls 124 coupled to the bottom of the first substrate 106. Although in FIGS. 7A-7C the assembly of the first semiconductor device package 102 is illustrated, it will be understood that a similar assembly may be performed to assemble any of the semiconductor packages shown in FIGS. 3-6. For example, the first semiconductor device package 202 may be assembled according to the assembly illustrated in FIGS. 7A-7C. As shown in FIGS. 7A-7B, the release film 113 extends across the bottom surface and side surfaces of the mold 103. In this manner, the release film 113 covers the side surfaces of the molding compound thereby allowing a portion of one or more bond wires (e.g., bond wire 210a, bond wire 310a, bond wire 410a) to abut and/or extend into the release film 113. As such, the portion of the bond wires that abuts and/or extends into the release film 113 may not be encapsulated by the molding compound thereby allowing that portion to be exposed at a side surface of the molding compound.

Figure 7D:
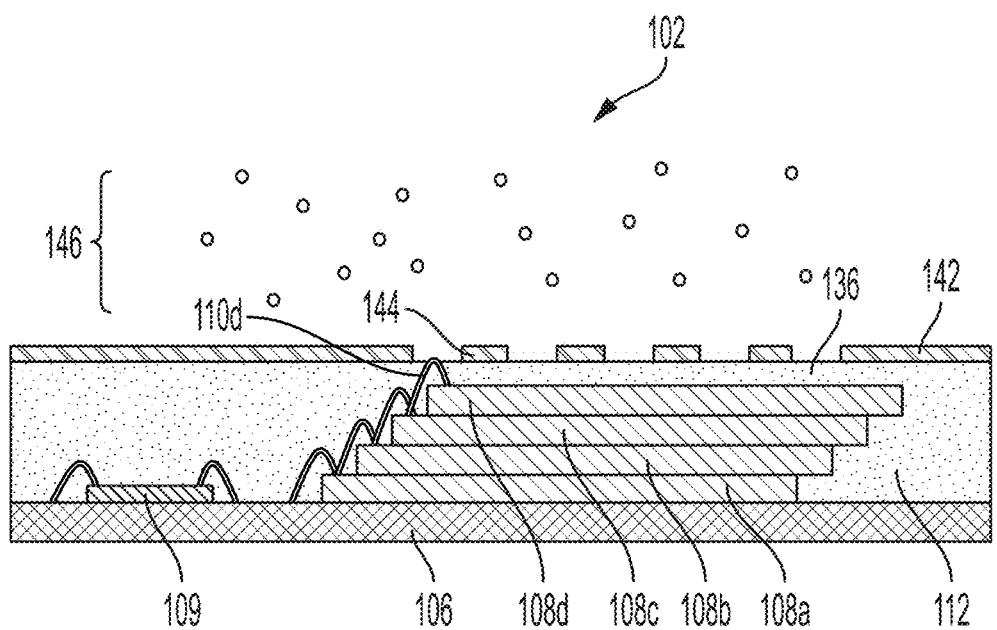

Referring to FIG. 7D, a removable mask 142 may be positioned on the top planar surface 136 of the first molding compound 112. The removable mask 142 may be configured to be removed from the top planar surface 136 of the first molding compound 112. The removable mask 142 may define one or more apertures 144 positioned along and extending through the removable mask 142. In some embodiments, one or more of the apertures 144 is positioned above the exposed portion of bond wire 110d such that the exposed portion of the bond wire 110d is positioned within the aperture 144 when the removable mask 142 is coupled to the top planar surface 136 of the first molding compound 112. In FIG. 7D, the removable mask 142 defines five apertures 144 that are generally the same size and shape, however, it will be understood that the removable mask 142 may define fewer than five apertures or more than five apertures, at least one of which may have a different shape, size and/or orientation than another.

The one or more apertures may define the position, orientation, and/or shape of one or more conductive elements (e.g., conductive pads 134 shown in FIG. 7E) to be formed on the top planar surface 136 of the first molding compound 112. In some embodiments, the one or more conductive pads 134 may be formed through a sputtering process. For example, ions 146 of a conductive material (e.g., copper) may be provided during the sputtering process. The ions 146 may be deposited onto the portions of the top planar surface 136 of the first molding compound 112 where apertures 144 are located. Put another way, the apertures 144 may act as openings on the removable mask 142 such that portions of the top planar surface 136 of the first molding compound 112 are not covered by the removable mask 142. In this manner, the ions 146 may be deposited onto the top planar surface 136 of the first molding compound to form one or more conductive elements (e.g., conductive pads 134). In some embodiments, the removable mask 142 may define one or more channels (not shown) extending between the apertures 144 such that during the sputtering process, ions 146 may be deposited onto the top planar surface 136 of the first molding compound 112, via the channels, to form electrical connections between the conductive pads 134.

Figure 7E:
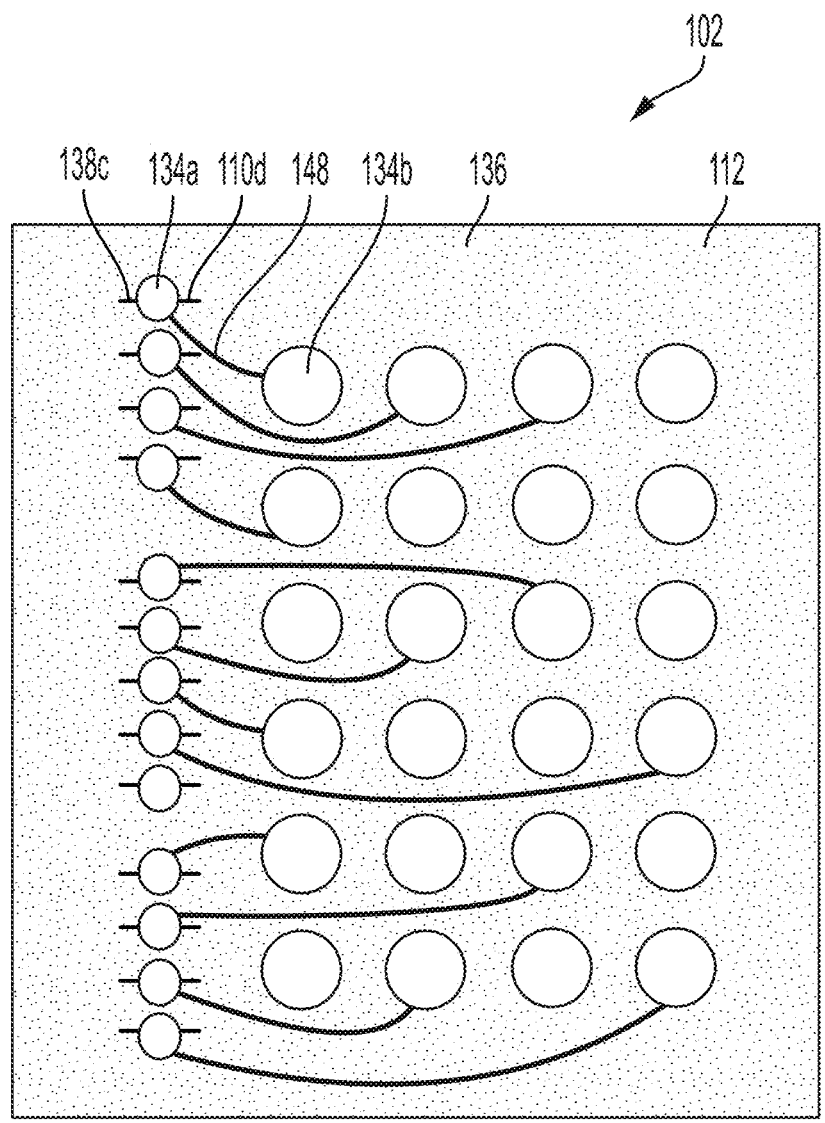

Referring to FIG. 7E, there is shown a top elevational illustration of the first semiconductor device package 102. The removable mask 142 may be removed from the top planar surface 136 of the first molding compound 112 subsequent to the sputtering process. As shown, there are multiple conductive pads 134 coupled to the top planar surface 136 of the first molding compound 112. Some of the conductive pads (e.g., first conductive pads 134a) may be electrically connected to the exposed portion (e.g., the intermediate section 138c) of the bond wire 110d. The remaining conductive pads (e.g., second conductive pads 134b) may be coupled to the top planar surface 136 of the first molding compound 112 such that they are not directly connected to the intermediate section 138c of the bond wire 110d. In FIG. 7E, there is a plurality of exposed bond wires generally the same as bond wire 110d and it will be understood that each may function generally the same as bond wire 110d. In some embodiments, there is an electrical connection (e.g., a trace 148) formed between a first conductive pad 134a and at least one of the second conductive pads 134b. As mentioned above, the removable mask 142 may include channels (not shown) that define a path for the traces 148 that extend between the first conductive pads 134a and the corresponding second conductive pad(s) 134b. The trace(s) 148 may be formed through the sputtering process illustrated in FIG. 7D.

In some embodiments, not all of the second conductive pads 134b may be electrically coupled to a corresponding first conductive pad 134a via a trace 148. Similarly, not all of the first conductive pads 134a may be electrically coupled to a corresponding second conductive pad 134b via a trace 148. For example, in FIG. 7E there are thirteen first conductive pads 134a and twenty second conductive pads 134b. Some of the second conductive pads 134b do not have a trace 148 electrically connecting the second conductive pad 134b to a first conductive pad 134a. Similarly, there is a first conductive pad 134a that is not electrically connected to a second conductive pad 134b via a trace 148. It will be understood that the first conductive pad 134a and second conductive pad 134b and traces 148 shown in FIG. 7E are examples and that any desired configuration of first and second conductive pads 134a, 134b and traces 148 may be included. For example, the number of first conductive pads 134a, and/or second conductive pads 134b may be different from what is shown in FIG. 7E. Similarly, the paths of and/or connections formed by traces 148 may be different from what is shown in FIG. 7E. In FIG. 7E, the first conductive pads 134a are smaller than the second conductive pads 134b, however it will be understood that the first and second conductive pads 134a, 134b may be generally the same size and/or shape.

Figure 7F:
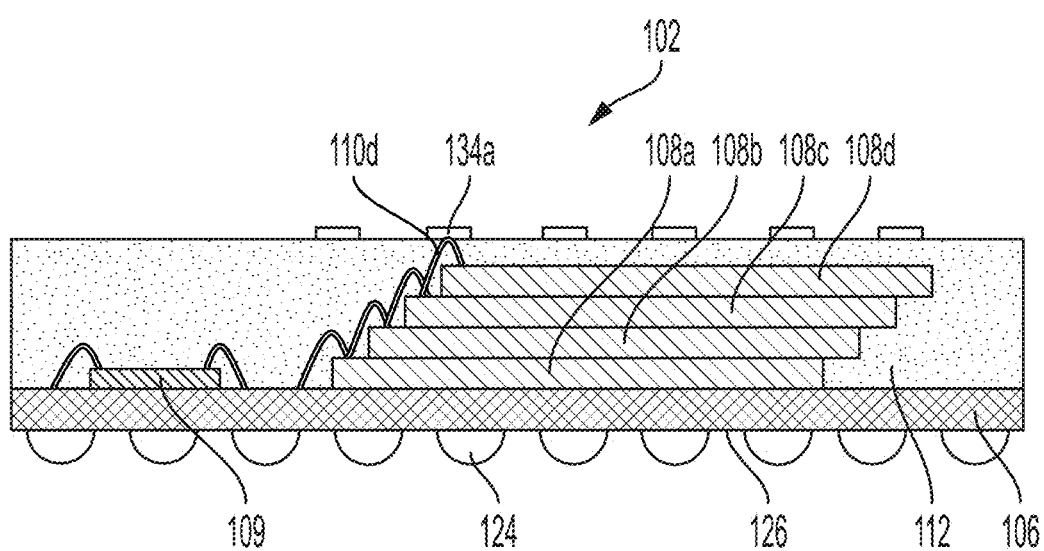

Referring to FIG. 7F, one or more solder balls 124 may be coupled to the bottom planar surface 126 of the first substrate 106. In some embodiments, the solder balls 124 are mechanically and electrically connected to the substrate 106 such that the solder balls 124 are in electrical communication with the components of the first semiconductor device package 102, as described above in more detail with reference to FIGS. 1-2.

Figure 7G:
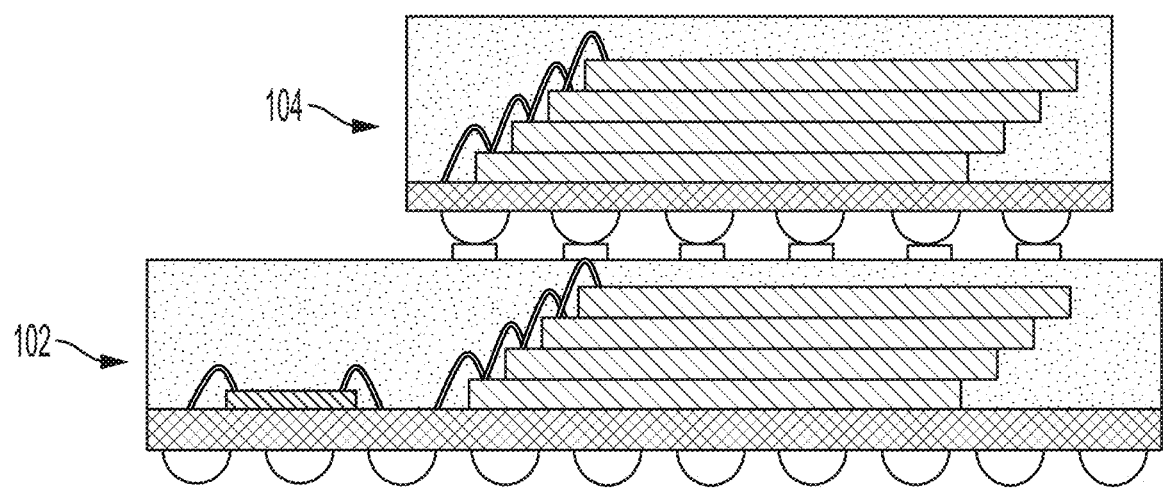

Referring to FIG. 7G, another semiconductor device package (e.g., second semiconductor device package 104) may be coupled to the first semiconductor device package 102. In some embodiments, the first semiconductor device package 102 and second semiconductor device package 104 are electrically coupled to one another, as discussed in more detail with reference to FIGS. 1-2. As such the mechanical and/or electrical coupling of the first and second semiconductor device packages 102, 104 will not be described in further detail here for the sake of brevity and so as not to obscure aspects of the present disclosure.

Figure 7H:
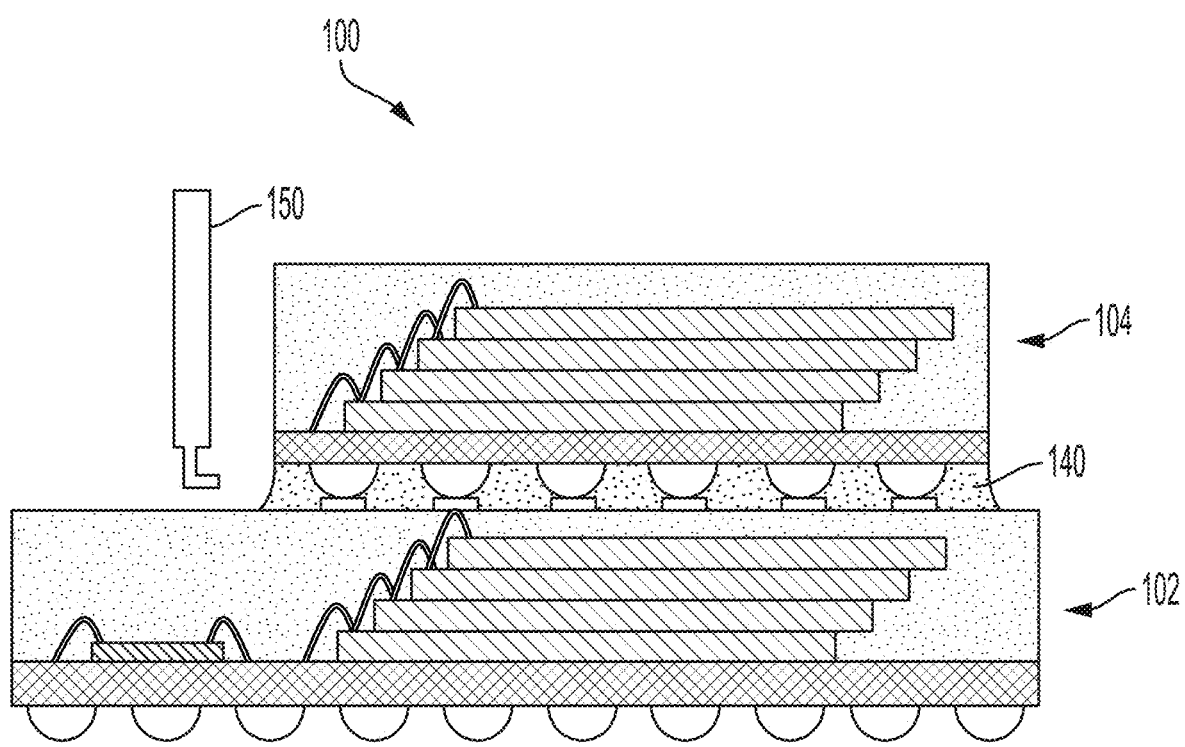

Referring to FIG. 7H, a liquid underfill 140 may be provided between the first semiconductor device package 102 and the second semiconductor device package 104 via a nozzle 150. For example, the nozzle 150 may be positioned such that an outlet of the nozzle 150 faces the space between the first semiconductor device package 102 and the second semiconductor device package 104. The liquid underfill 140 may be flowed through the outlet of the nozzle 150 such that the underfill 140 encapsulates the components connecting the first and second semiconductor device packages 102, 104. In this manner the semiconductor device package 100 may be assembled. The underfill 140 is described above with reference to FIGS. 1-2 and will not be described again for sake of brevity and so as not to obscure aspects of the present disclosure.

Figure 8A:
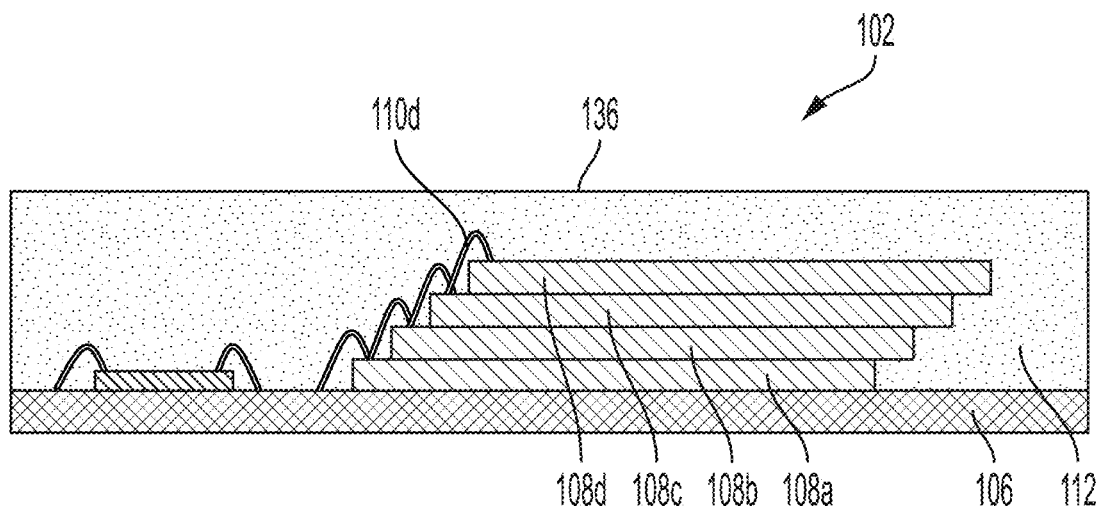
FIGS. 8A-8B are cross-sectional side views illustrating an alternative assembly of a semiconductor device package having a bond wire partially exposed in accordance with an embodiment of the present disclosure.
Figure 8B:
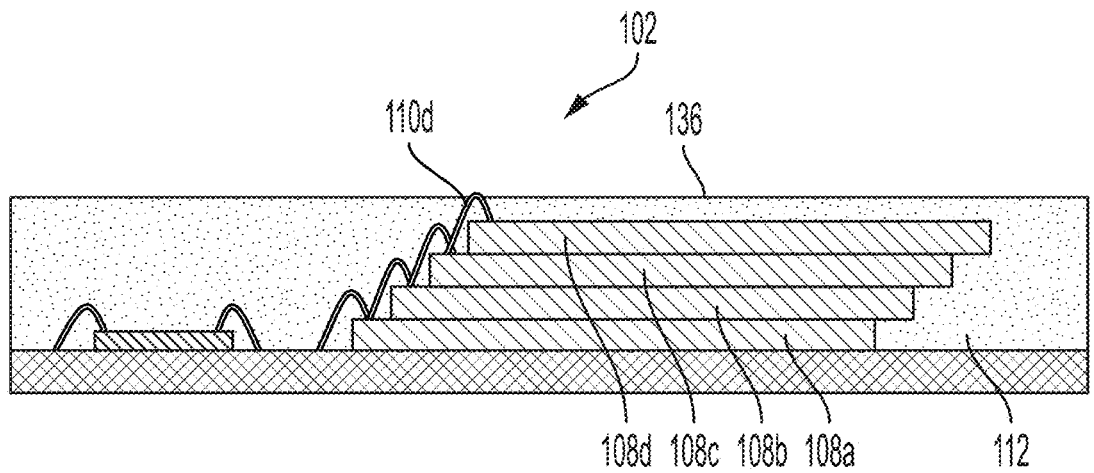

Referring to FIGS. 8A-8B, there is illustrated an alternative assembly of a semiconductor device package (e.g., the first semiconductor device package 102) having an exposed bond wire. In FIG. 8A, the substrate 102, and the components coupled thereto, may be at least partially encapsulated by the first molding compound 112 in a manner similar to what is illustrated in FIGS. 7A-7B except that the top planar surface 136 of the first molding compound 112 may entirely encapsulate the bond wire 110d. In some embodiments, the molding compound 112 may be exposed to an etching process (e.g., chemical etching, laser etching, plasma etching), such that a layer of the molding compound 112 is removed. In this manner, the top planar surface 136 may be moved closer to the substrate 106 such that the bond wire 110d is at least partially exposed at the top planar surface 136 of the first molding compound 112 (as shown in FIGS. 7C and 8B). The assembly of the combined semiconductor device package 100 may subsequently include the steps illustrated in FIGS. 7D-7H.

It will be appreciated by those skilled in the art that changes could be made to the exemplary embodiments shown and described above without departing from the broad inventive concepts thereof. It is understood, therefore, that this invention is not limited to the exemplary embodiments shown and described, but it is intended to cover modifications within the spirit and scope of the present invention as defined by the claims. For example, specific features of the exemplary embodiments may or may not be part of the claimed invention and various features of the disclosed embodiments may be combined. The words "right", "left", "lower" and "upper" designate directions in the drawings to which reference is made. Unless specifically set forth herein, the terms "a", "an" and "the" are not limited to one element but instead should be read as meaning "at least one".

It is to be understood that at least some of the figures and descriptions of the invention have been simplified to focus on elements that are relevant for a clear understanding of the invention, while eliminating, for purposes of clarity, other elements that those of ordinary skill in the art will appreciate may also comprise a portion of the invention. However, because such elements are well known in the art, and because they do not necessarily facilitate a better understanding of the invention, a description of such elements is not provided herein.

Further, to the extent that the methods of the present invention do not rely on the particular order of steps set forth herein, the particular order of the steps should not be construed as limitation on the claims. Any claims directed to the methods of the present invention should not be limited to the performance of their steps in the order written, and one skilled in the art can readily appreciate that the steps may be varied and still remain within the spirit and scope of the present invention.

What is claimed is:

1. A semiconductor device package comprising:
a first substrate having an electrical circuit;
a plurality of semiconductor dies stacked one on top of the other and positioned above the first substrate;
a plurality of bond wires electrically connected one to another and electrically coupling the plurality of semiconductor dies to one another and to the electrical circuit on the first substrate, the plurality of bond wires including a first bond wire having a first portion connected to a first semiconductor die of the plurality of semiconductor dies, a second portion connected to a second semiconductor die of the plurality of semiconductor dies, and an intermediate portion between the first portion and second portion;
a molding compound encapsulating the plurality of semiconductor dies, the first portion of the first bond wire, and second portion of the first bond wire, wherein the molding compound has top and side planar surfaces, the side planar surface being substantially perpendicular to the top planar surface;
wherein the intermediate portion of the first bond wire is exposed along the top planar surface of the molding compound; and
wherein the intermediate portion of the first bond wire is configured to contact a conductive component.

2. The semiconductor device package of claim 1, wherein the conductive component is a conductive pad positioned on the top planar surface of the molding compound.

3. The semiconductor device package of claim 2 further comprising:
a second substrate;
a solder ball;
a third semiconductor die;
a second bond wire electrically coupling the third semiconductor die to the second substrate,
wherein the solder ball is electrically connected to the conductive pad such that the third semiconductor die is in electrical communication with the plurality of semiconductor dies and the electrical circuit of the first substrate.

4. The semiconductor device package of claim 3, further comprising:
a set of third bond wires each electrically coupling the plurality of semiconductor dies to the electrical circuit of the first substrate, each third bond wire of the set of third bond wires including a first portion connected to the first semiconductor die of the plurality of semiconductor dies, a second portion connected to the second semiconductor die of the plurality of semiconductor dies, and an intermediate portion extending between the first portion and second portion of each of the set of third bond wires,
wherein the molding compound encapsulates the first portion and second portion of each of the set of third bond wires,
wherein the intermediate portion of each of the third bond wires is exposed along the top planar surface of the molding compound, and
wherein the intermediate portion of each bond wire of the third set of bond wires is configured to contact each of a plurality of conductive components.

5. The semiconductor device package of claim 2, wherein the conductive pad is coupled to the top planar surface of the molding compound and is electrically connected to the intermediate portion of the first bond wire.

6. The semiconductor device package of claim 1, wherein the intermediate portion has a surface area that is greater than a cross section of the first bond wire.

7. The semiconductor device package of claim 1, wherein the second semiconductor die is disposed between the first semiconductor die and the first substrate.

8. A semiconductor device package comprising:
a first substrate having an electrical circuit;
a plurality of semiconductor dies stacked one on top of the other and positioned above the first substrate;
a plurality of bond wires electrically connected one to another and electrically coupling the plurality of semiconductor dies to one another and to the electrical circuit on the first substrate, the plurality of bond wires including a first bond wire having a first portion connected to a first semiconductor die of the plurality of semiconductor dies, a second portion connected to the electrical circuit of the first substrate, and an intermediate portion between the first portion and second portion;
a molding compound encapsulating the plurality of semiconductor dies, the first portion of the first bond wire, and second portion of the first bond wire, wherein the molding compound has top and side planar surfaces, the side planar surface being substantially perpendicular to the top planar surface;
wherein the intermediate portion of the first bond wire is exposed along the side planar surface of the molding compound; and
wherein the intermediate portion of the first bond wire is configured to contact a conductive component.

9. The semiconductor device package of claim 8, wherein the conductive component is a redistribution layer positioned on the side planar surface of the molding compound.

10. The semiconductor device package of claim 9 further comprising:
a second substrate having a top planar surface and an electrical circuit, the top planar surface being oriented generally perpendicular to the top planar surface of the first substrate;
a second redistribution layer electrically connected to the top planar surface of the second substrate; and
a solder ball electrically connecting the redistribution layer positioned on the side planar surface of the molding compound to the second redistribution layer.

11. The semiconductor device package of claim 10 further comprising:
a third substrate having a top planar surface and an electrical circuit, the top planar surface being oriented generally parallel to the top planar surface of the first substrate;
a second plurality of semiconductor dies stacked one on top of the other and positioned above the third substrate;
a second plurality of bond wires electrically connected one to another and electrically coupling the second plurality of semiconductor dies to one another and to the electrical circuit on the third substrate, the second plurality of bond wires including a first bond wire having a first portion connected to a first semiconductor die of the second plurality of semiconductor dies, a second portion connected to the electrical circuit of the third substrate, and an intermediate portion between the first portion and second portion;
a second molding compound encapsulating the second plurality of semiconductor dies, the first portion of the first bond wire, and second portion of the first bond wire, wherein the second molding compound has top and side planar surfaces, the side planar surface being substantially perpendicular to the top planar surface;
a third redistribution layer coupled to the side planar surface of the second molding compound; and
a second solder ball electrically connected to the third redistribution layer,
wherein the intermediate portion of the first bond wire is exposed along the side planar surface of the second molding compound and is electrically connected to the third redistribution layer, and
wherein the second solder ball is electrically connected to a fourth redistribution layer electrically connected to the top planar surface of the second substrate.

12. The semiconductor device package of claim 8, wherein the conductive pad is coupled to the side planar surface of the molding compound and electrically connected to the intermediate portion of the first bond wire.

13. The semiconductor device package of claim 8, wherein the intermediate portion has a surface area that is greater than a cross section of the first bond wire.

14. A method of forming a semiconductor device package comprising:
providing a first substrate having an electrical circuit;
providing one or more components coupled to the first substrate, the one or more components comprising:
a plurality of semiconductor dies stacked one on top of the other and positioned above the first substrate; and
a plurality of bond wires electrically connected one to another and electrically coupling the plurality of semiconductor dies to one another and to the electrical circuit of the first substrate, the plurality of bond wires including a first bond wire having a first portion connected to a first semiconductor die of the plurality of semiconductor dies, a second portion connected to a second semiconductor die of the plurality of semiconductor dies, and an intermediate portion extending between the first portion and second portion;
encapsulating the plurality of semiconductor dies, and the first portion and second portion of the first bond wire with a molding compound, wherein the molding compound has top and side planar surfaces, the side planar surface being substantially perpendicular to the top planar surface; and
exposing the intermediate portion of the first bond wire along the top planar surface of the molding compound, wherein the intermediate portion of the first bond wire is configured to contact a conductive component.

15. The method of claim 14, wherein the conductive component is one of a conductive pad and a redistribution layer formed on the surface of the molding compound.

16. The method of claim 15 further comprising:
providing a second substrate;
providing a solder ball;
providing a third semiconductor die;
providing a second bond wire electrically coupling the third semiconductor die to the second substrate; and
electrically connecting the solder ball to the conductive pad such that the third semiconductor die is in electrical communication with the plurality of semiconductor die and the electrical circuit of the first substrate.

17. The method of claim 14, wherein the conductive component is coupled to the top surface of the molding compound at the intermediate portion of the first bond wire.

18. The method of claim 14 further comprising:
providing a set of third bond wires each electrically coupling the plurality of semiconductor dies to the electrical circuit of the first substrate, each third bond wire of the set of third bond wires including a first portion connected to the first semiconductor die of the plurality of semiconductor dies, a second portion connected to the second semiconductor die of the plurality of semiconductor dies, and an intermediate portion extending between the first portion and second portion of each of the set of third bond wires;
encapsulating the first portion and second portion of each of the set of third bond wires with the molding compound; and
exposing the intermediate portion of each of the third bond wires is exposed along the top planar surface of the molding compound, and
wherein the intermediate portion of each bond wire of the third set of bond wires is configured to contact each of a plurality of conductive components.

19. The method of claim 14, wherein the intermediate portion has a surface area that is greater than a cross section of the first bond wire.

20. The method of claim 14, wherein the second semiconductor die is disposed between the first semiconductor die and the first substrate.

* * * * *